United States Patent [19]

Taya et al.

[11] Patent Number: 4,599,516
[45] Date of Patent: Jul. 8, 1986

[54] SPECIMENS ROTATING DEVICE

[75] Inventors: Shunroku Taya, Mito; Takeshi Koike, Ibaraki; Mitsuo Komatsu, Katsuta, all of Japan

[73] Assignee: Hitachi, Ltd., Tokyo, Japan

[21] Appl. No.: 472,199

[22] Filed: Mar. 4, 1983

[30] Foreign Application Priority Data

Mar. 5, 1982 [JP] Japan .................. 57-33918

[51] Int. Cl.$^4$ ............................................... G21K 5/08
[52] U.S. Cl. .............................. 250/443.1; 250/492.2; 165/47
[58] Field of Search ............... 422/72, 64, 104; 494/13, 14; 250/443.1, 492.2; 436/45; 165/47 H, 104.26, 86, 47, 104.22, 104.18, 104.28; 118/500, 59

[56] References Cited

U.S. PATENT DOCUMENTS

| | | | |
|---|---|---|---|
| 3,151,669 | 10/1964 | Quenneville | 165/47 H |
| 4,116,266 | 9/1978 | Sawata et al. | 165/105 |
| 4,228,358 | 9/1980 | Ryding | 250/457 |
| 4,247,781 | 1/1981 | Bayer et al. | 250/492.2 |
| 4,274,476 | 6/1981 | Garrett | 165/80 E |
| 4,291,676 | 9/1981 | Asselman et al. | 126/433 |
| 4,453,080 | 6/1984 | Berkowitz | 250/443.1 |

FOREIGN PATENT DOCUMENTS 0630513 10/1978 U.S.S.R. ................ 165/86 H

Primary Examiner—Barry S. Richman
Assistant Examiner—Michael S. Gzybowski
Attorney, Agent, or Firm—Antonelli, Terry & Wands

[57] ABSTRACT

A specimens rotating device including a cooling source located in the central portion of a rotary plate, and a plurality of specimens arranged in the peripheral portion of the rotary plate in a manner to surround the cooling source. A plurality of heat pipes are arranged between the cooling source and the specimens so that each heat pipe is secured at one end to the cooling source and at the other end to one of the specimens. Each heat pipe has a working fluid sealed therein and its one end is exposed in a cooling fluid in a channel in the cooling source. Upon rotation of the rotary plate, the specimens are rotated along with the rotary plate, and the working fluid in the heat pipes is shifted toward the specimens. The working fluid absorbs heat from the specimens and evaporates into vapor which quickly returns to the cooling source due to the difference in vapor pressure to condense into condensate by releasing the latent heat of evaporation into the cooling source which constantly receives a fresh supply of cooling fluid, to enable the heat from the specimens to be effectively released to outside.

10 Claims, 6 Drawing Figures

SPECIMENS ROTATING DEVICE

BACKGROUND OF THE INVENTION

1. Field of the Invention

This invention relates to specimens rotating devices, and more particularly to a specimens rotating device suitable for use with an ion implantation apparatus.

2. Description of the Prior Art

Ion implantation apparatus have in recent years been required to increase a throughput by increasing as much as possible the amount of an ionic current and reducing the time required for performing an implantation operation. An increase in the amount of ions by tenfold would increase by tenfold the heating power of the ions to which the specimens or wafers are exposed, thereby causing an abrupt rise in temperature.

To avoid a rise in temperature, it has hitherto been usual practice to arrange a plurality of wafers in a peripheral portion of a rotary plate in an ion implantation chamber and rotate the rotary plate at a velocity of rotation of about 250 revolutions per minute to lead the plurality of wafers successively to an ion implantation position to carry out ion implantation operations repeatedly. By this arrangement, the wafers are exposed to irradiation of ions in the form of pulses, with one revolution of the rotary plate serving as one cycle, so that the wafers can be naturally cooled during the periods other than the periods for the pulses.

Such natural cooling is not enough to obtain satisfactory cooling of the wafers. Thus, the present practice is to perform cooling of the central portion of the rotary plate with water thereby to cool the wafers through the rotary plate. To increase the effects achieved in cooling the wafers would require an improvement in the heat transfer performance of the rotary plate which in turn would require an increase in the thickness of the rotary plate. Thus, the rotary plate would become heavy in weight and a load applied to a motor for driving the rotary plate would rise, thereby not only making it necessary to use a complicated device for effecting control of the revolution of the rotary plate but also causing the rotary plate to become unbalanced during rotation and make a large noise.

Proposals have been made to lead water from the central portion of the rotary plate to the vicinity of the wafers arranged in the peripheral portion of the rotary plate so as to directly cool the wafers with water as much as possible. However, an ion implantation chamber is generally maintained at a vacuum of about $10^{-5}$ to $10^{-6}$ Torr and the channels through which the water flows in the rotary plate should be kept at a pressure given as the sum of the atmospheric pressure and the pressure of water at which it should be forced to flow, so that the rotary plate should be given with a thickness large enough to withstand the large pressure differential between the pressure in the water channels and the internal pressure of the ion implantation chamber. As a result, the rotary plate would have its weight increased to an extent such that the mechanism for controlling the revolution of the rotary plate would become disproportionately large in size and the rotary plate would become unbalanced during rotation, thereby making a large noise.

SUMMARY OF THE INVENTION

This invention has been developed for the purpose of obviating the aforesaid disadvantages of the prior art. Accordingly one object of the invention is to provide a specimens rotating device capable of effectively cooling the specimens.

Another object is to provide a specimens rotating device which eliminates the need to use means for rotating the specimens of a large scale in spite of a satisfactory cooling of the specimens being obtained.

According to the invention, there is provided a specimens rotating device comprising a cooling source, means for rotating about said cooling source a plurality of specimens arranged around the cooling source, and means for transmitting heat from the plurality of specimens to the cooling source by evaporation of a working fluid and condensation of vapor produced by the evaporation of the working fluid thereby cooling the specimens.

Additional and other objects, features and advantages of the invention will become apparent from the description set forth hereinafter when considered in conjunction with the accompanying drawings.

DESCRIPTION OF THE PREFERRED EMBODIMENT

Figure 1:
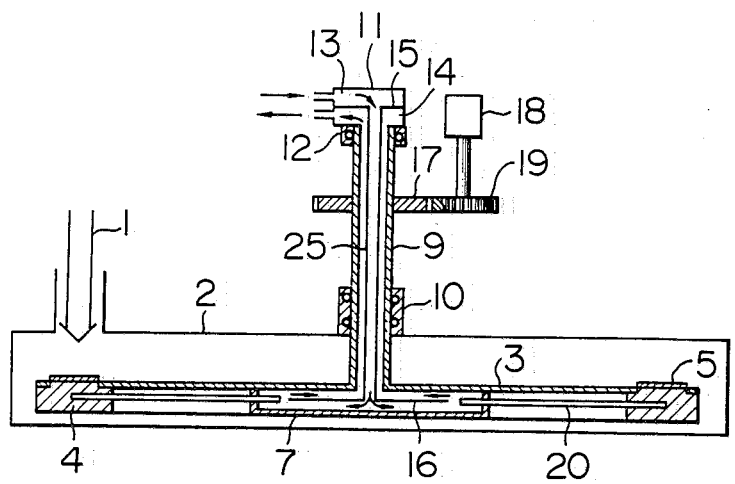
FIG. 1 is a vertical sectional view of the specimens rotating device comprising one embodiment of the invention.
Figure 2:
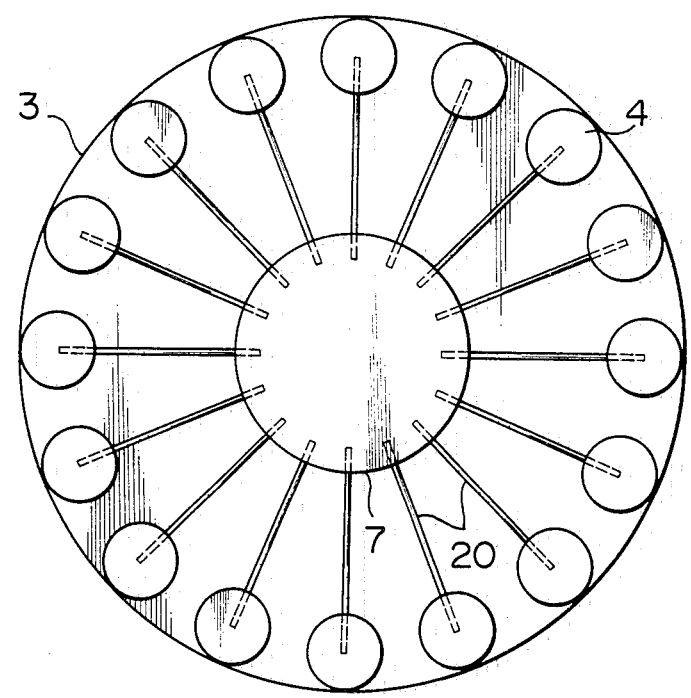
FIG. 2 is a bottom plan view of the rotary plate portion of the specimens rotating device shown in FIG. 1.

FIGS. 1 and 2 show one embodiment of the invention in which an ion beam injection port 1 is formed in an ion implantation chamber 2 maintained at a vacuum of about $10^{-5}$ to $10^{-6}$ Torr and having a rotary plate 3 mounted therein. The rotary plate 3 has mounted in its outer peripheral portion a plurality of specimen support members 4 each supporting a specimen or wafer 5 kept in intimate contact therewith by a plate spring, not shown. Located in the central portion of the rotary plate 3 is a cooling source 7 with which a hollow drive shaft 9 is maintained in communication. The hollow drive shaft 9 which is journalled for rotation by a bearing 10 mounted on the chamber 2 and a bearing 12 mounted on a water cooling head 11 has inserted therein a water channel defining hollow shaft 25 which is connected at one end to a partition wall 15 partitioning the water cooled head 11 into a cooling water inlet port 13 and a cooling water outlet port 14 in such a manner that the water channel defining hollow shaft 25 is maintained in communication with the inlet port 13. The water channel defining hollow shaft 25 extends into the cooling source 7 and has secured at the other end a water channel defining partition plate 16.

The hollow drive shaft 9 has secured thereto a gear 17 which is in meshing engagement with a gear 19 directly connected to a motor 18.

Heat pipes 20 extending radially from the cooling source 7 connect the wafers 5 with the cooling source 7. More specifically, each heat pipe 20 is rigidly secured at one end to the cooling source 7 such that the end is exposed to a cooling fluid in a channel of the cooling source 7 and is rigidly embedded at the other end in the associated specimen support member 4.

Figure 3:
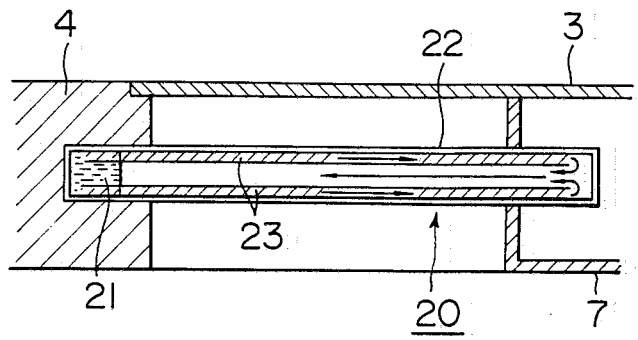
FIG. 3 is a vertical sectional view of the heat pipe shown in FIGS. 1 and 2.

As shown in FIG. 3, each heat pipe 20 comprises a sealed vessel 22 containing a working fluid (water in this embodiment) 21 sealed therein, and a wick 23 mounted on an inner wall surface of the sealed vessel 22 and formed of porous material. In this case, all the heat pipes 20 could be considered to constitute a single heat transfer means and the interior of each sealed vessel of the heat pipe 20 could be considered to be a sealed hollow portion extending from the cooling source 7 to each of the plurality of wafers 5.

Upon actuation of the motor 18, the hollow drive shaft 9 is rotated through the gears 19 and 17 to cause the rotary plate 3 and thus the wafers 5 supported on the specimen support members 4 to rotate about an axis of rotation of the rotary plate 3 at a rate of 250 revolutions per minute, for example. Thus, the wafers 5 are repeatedly exposed to irradiation of ion beams for cycles equal in number to the revolutions of the rotary plate 3, thereby effecting implantation of ions in each of the wafers 5.

Meanwhile cooling water which is the cooling fluid in this embodiment is led through the inlet port 13 of the cooling head 11 through the water channel defining hollow shaft 25 to the cooling source 7, from which the cooling water flows through a water channel defined between an inner wall surface of the hollow drive shaft 9 and an outer wall surface of the channel defining hollow shaft 25 to the outlet port 14 to be released to outside.

In the heat pipes 20, the working fluid 21 moves toward the specimen support members 4 by the action of centrifugal forces and capillary action of the wick 23 and the working fluid 21 thus moved toward the members 4 evaporates by absorbing heat from the members 4 and wafers 5. The vapor thus generated quickly flows toward the cooling source 7 due to the difference in vapor pressure and condenses therein. At this time, the heat absorbed by the working fluid 21 when it evaporates or the latent heat of evaporation is released into the cooling source 7. The condensate produced by condensation of the vapor is returned to its original place by centrifugal forces and capillary action of the wick 23 to repeat the same process thereafter.

In the heat pipes 20, transfer of heat in the form of latent heat of evaporation takes place in a process of evaporation of the liquid phase, moving of the vapor phase generated by the evaporation, condensation of the moved vapor phase and returning of the liquid phase produced by the condensation, so that the wafers 5 are cooled by the latent heat of evaporation. The heat conductivity of the heat pipes 20 is over ten times as high as that of copper and enables cooling of the wafers 5 to be effected satisfactorily.

When the working fluid 21 is water and the temperature of water in use is below 80° C., the vapor pressure of the water is below 0.5 atmospheric pressure (380 Torr).

If the heat pipes 20 were not used and the water channels of the cooling source 7 were extended to the vicinity of the wafers 5, the water channels would be maintained at a pressure representing the sum of the atmospheric pressure and the pressure of water under which the water is forced to flow through the channels.

Thus the internal pressure of the heat pipes 20 can be much lower than would be the case if the channels of the cooling source 7 were extended to the vicinity of the wafers 5. As a result, the use of the heat pipes 20 does not result in any increase in the weight of the rotating parts of the device in view of the fact that the heat pipes 20 are very simple in construction and yet have a very high heat conductivity as described hereinabove.

Figure 4:
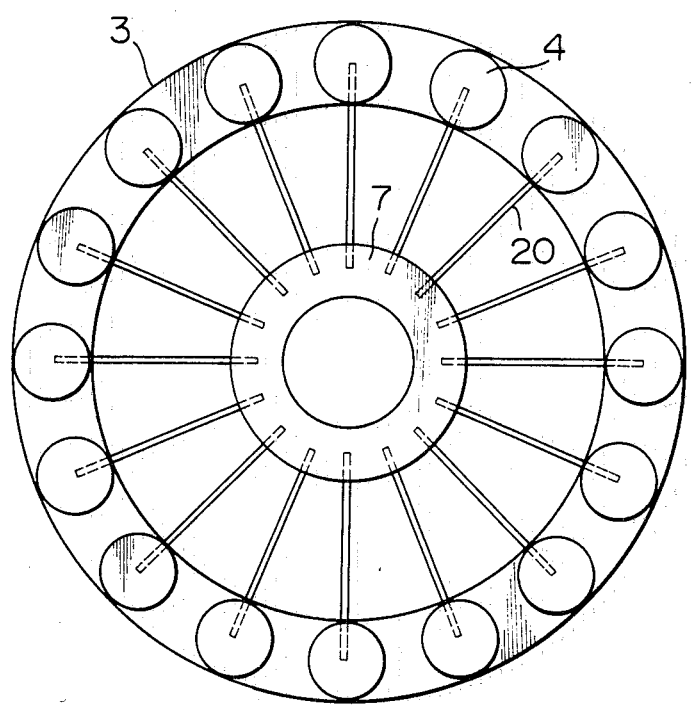
FIG. 4 is a bottom plan view of one modification of the rotary plate portion of the specimens rotating device shown in FIG. 1.

FIG. 4 shows a modification of the rotary plate portion shown in FIG. 2. The rotary plate shown in FIG. 4 is distinct from that shown in FIG. 2 in that parts thereof other than the central portion and the peripheral portion of the rotary plate 3 are cut out. In this modification, the heat pipes 20 perform the function of supporting the wafers 5 with respect to the cooling source 7 and the function of transmitting heat between the cooling source 7 and the wafers 5. This modification is conducive to a greater reduction in weight of the rotating parts.

The heat pipes 20 used in this embodiment have been described as being of what is generally referred to as a capillary type using wicks. However, the invention is not limited to this specific type of heat pipes and heat pipes of a siphon type using no wicks may be used. If heat pipes of the latter type were used, moving of the liquid phase would be caused only by centrifugal forces.

The heat pipes 20 may have fins at inner surfaces of the ends connected to the support members 4 for the wafers 5 in order to increase as much as possible the area of contact with the working fluid 21.

Figure 5:
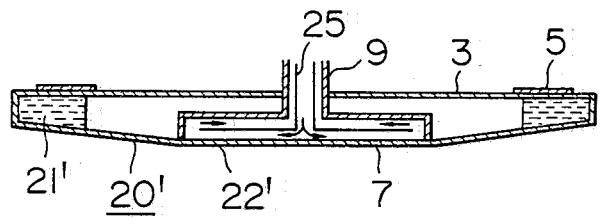
FIG. 5 is a vertical sectional view of another modification of the rotary plate portion of the specimens rotating device shown in FIG. 1.
Figure 6:
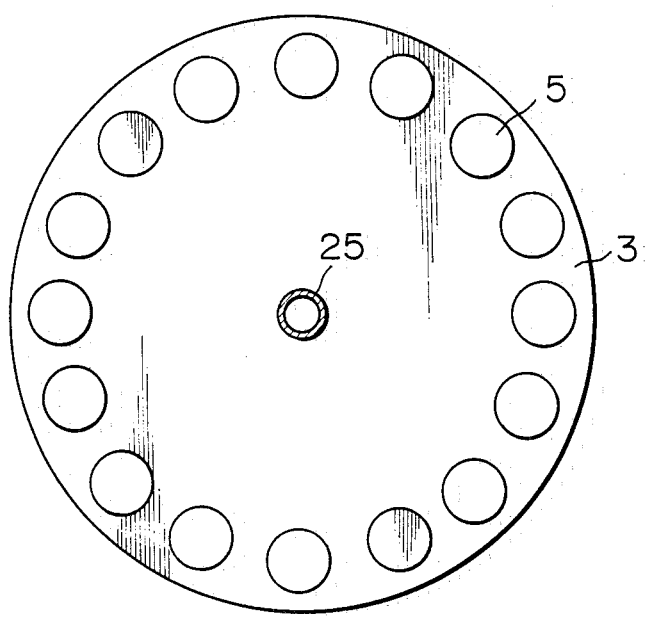
FIG. 6 is a top plan view of the modification of the rotary plate portion shown in FIG. 5.

FIGS. 5 and 6 show another modification of the rotary plate portion according to the invention. In this modification, the heat pipes 20 equal in number to the wafers 5 used as means for transmitting heat between the cooling source 7 and the wafers 5 are replaced by a sealed vessel 22' containing a working fluid 21' sealed therein. The sealed vessel 22' could be considered to be a rotary member and thus a space or cavity defined in the rotary member could be considered to correspond to the sealed vessel 22'. The sealed vessel 22' is of a doughnut shape and in the form of a disc and has the cooling source 7 rigidly secured to its inner end and the plurality of wafers 5 supported in contact with its outer end through plate springs, not shown. Heat transfer takes place in the sealed vessel on the same principle as in the heat pipes 20. The sealed vessel 22' having the working fluid 21' sealed therein might be referred to as a heat disc 20' because it is of a disc shape rather than a pipe shape. Then, as long as the heat disc 20' is used, one only has to use a single heat disc as compared with a plurality of heat pipes that should be used when heat pipes are used.

The modification of the embodiment shown in FIGS. 5 and 6 is conducive to a greater reduction in weight of the rotating parts of the device in view of the heat disc 20' used being only one in number.

While the preferred embodiment and its modifications have been shown and described, it is to be understood that they are for purposes of illustration only and not limiting the scope of the invention.

What is claimed is:

1. A device for rotating a specimen, comprising:
   a cooling source comprising a first cooling fluid;
   means for rotating a specimen around the cooling source; and
   means for thermally connecting the specimen to the cooling source, the connecting means including a second working fluid which rotates around the cooling source together with the specimen so that centrifugal force is imparted to the working fluid, to thereby move the same toward the specimen in a direction substantially perpendicular to a rotating axis of the specimen, the specimen being cooled through heat transfer from the specimen to the cooling source in a direction opposite to said substantially perpendicular direction, based on evaporation of the working fluid moved toward the specimen and condensation of the evaporated working fluid moved toward the cooling source due to a difference in vapor pressure of the working fluid said means for thermally connecting the specimen to the cooling source.

2. A device for rotating specimens, comprising:
   a cooling source comprising a first cooling fluid;
   means for rotating specimens around the cooling source, the specimens being arranged around the cooling source; and
   means for thermally connecting the specimens to the cooling source, the connecting means including heat pipes extending from the cooling source to the specimens in a direction substantially perpendicular to a rotating axis of the specimens, each of the heat pipes including a second working fluid therein, the heat pipes being rotatable around the cooling source together with the specimens so that centrifugal force is imparted to the working fluids to thereby move the same toward the specimens in said substantially perpendicular direction, the specimens being cooled through heat transfer from the speciments to the cooling source in a direction opposite to said substantially perpendicular direction, based on evaporation of the working fluids moved toward the specimens and condensation of the evaporated working fluid moved toward the cooling source due to a difference in vapor pressure of the working fluids in said heat pipes.

3. A device for rotating specimens according to claim 2, wherein the second working fluid is water.

4. A device for rotating specimens according to claim 2, wherein the cooling source is provided with a channel for said first cooling fluid to flow therethrough, and means are provided for causing the said first fluid to flow through the channel.

5. A device for rotating specimens according to claim 4, wherein the heat pipes are connected to the cooling source in such a manner that each of the heat pipes is exposed to the first cooling fluid flowing through the channel.

6. A device for rotating specimens according to claim 5, wherein the second working fluid is water and the first cooling fluid is water.

7. A device for rotating specimens comprising a cooling source comprising a first cooling fluid, a rotary member defining a hollow doughnut shaped interior space therein, the rotary member being thermally connected to the cooling source, and means for rotating both the rotary member and the cooling source together about a common axis, the rotary member supporting the specimens on a peripheral portion thereof, the doughnut shaped interior space having a second working fluid therein, the working fluid being rotatable around the cooling source so that centrifugal force is imparted to the working fluid to thereby move the same toward the peripheral portion of the rotary member in a direction substantially perpendicular to the rotating axis of the rotating member, the specimens being cooled through heat transfer from the specimens to the cooling source in a direction opposite to said substantially perpendicular direction based on evaporation of the working fluid moved toward the peripheral portion of the rotary member and condensation of the evaporated working fluid moved toward the cooling source due to a difference in vapor pressure of the working fluid in the doughnut shaped interior of the rotary member.

8. A device for rotating specimens according to claim 7, wherein the second working fluid is water.

9. A device for rotating specimens according to claim 8, wherein the cooling source is provided with a channel for said first cooling fluid to flow therethrough, and means are provided for causing said first cooling fluid to flow through the channel.

10. A device for rotating specimens according to claim 9, wherein the first cooling fluid is water.

* * * * *